(12) United States Patent
He et al.

(10) Patent No.: US 12,004,394 B2
(45) Date of Patent: Jun. 4, 2024

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Fan He, Beijing (CN); Hongwei Ma, Beijing (CN); Xiangdan Dong, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 400 days.

(21) Appl. No.: 17/520,503

(22) Filed: Nov. 5, 2021

(65) Prior Publication Data

US 2022/0310759 A1 Sep. 29, 2022

(30) Foreign Application Priority Data

Mar. 29, 2021 (CN) .......................... 202110333034.2

(51) Int. Cl.
*H01L 27/32* (2006.01)
*H10K 59/131* (2023.01)

(52) U.S. Cl.
CPC ................................. *H10K 59/131* (2023.02)

(58) Field of Classification Search
CPC ....... H01L 33/62; H01L 23/14; H01L 33/005; H01L 2933/0033; H01L 27/124; H05K 1/118; H05K 3/323; H05K 1/189; H10K 59/10; H10K 59/131; G09G 3/3225; G09G 2300/0426
See application file for complete search history.

(56) References Cited

U.S. PATENT DOCUMENTS 10,833,241 B1 * 11/2020 Lewandowski ....... H01L 23/367
2002/0018176 A1 2/2002 Kobayashi et al.
(Continued)

FOREIGN PATENT DOCUMENTS

| CN | 106896609 A | 6/2017 |
| CN | 110265409 A | 9/2019 |
| CN | 111736395 A | 10/2020 |

OTHER PUBLICATIONS

CN202110333034.2 first office action.

*Primary Examiner* — Jarrett J Stark
(74) *Attorney, Agent, or Firm* — IPro, PLLC

(57) ABSTRACT

The disclosure discloses a display substrate and a display device. The display substrate includes a base substrate, and a first wire layer, a first insulating layer, a transitional connection layer, a second insulating layer, a third insulating layer, and a second wire layer sequentially arranged on a wire changing region of the substrate; first wires of the first wire layer are electrically connected to electrical connection portions of the transitional connection layer through a first opening of the first insulating layer, and the electrical connection portions are electrically connected to second wires of the second wire layer through a second opening of the second insulating layer and a third opening of the third insulating layer; at least two of a projection of the first opening, a projection of the second opening, or a projection of the third opening on the substrate are staggered in positions.

20 Claims, 3 Drawing Sheets

(56) References Cited

U.S. PATENT DOCUMENTS

| | | | |
|---|---|---|---|
| 2015/0041205 A1* | 2/2015 | Chien | H05K 1/0268 |
| | | | 174/264 |
| 2018/0152016 A1* | 5/2018 | Honda | H10N 60/30 |
| 2018/0314120 A1 | 11/2018 | Peng | |
| 2021/0358971 A1 | 11/2021 | Chen et al. | |
| 2022/0271006 A1* | 8/2022 | Okutsu | H01L 23/3677 |
| 2023/0197320 A1* | 6/2023 | Setiawan | H01C 1/084 |
| | | | 174/252 |

\* cited by examiner

DISPLAY SUBSTRATE AND DISPLAY DEVICE

CROSS REFERENCE TO RELATED APPLICATIONS

The present disclosure claims priority to Chinese Patent Application No. 202110333034.2, filed with the China National Intellectual Property Administration on Mar. 29, 2021, the content of which is incorporated herein by reference in its entirety.

FIELD

The present disclosure relates to the field of the display technology, and particularly to a display substrate and a display device.

BACKGROUND

With the rapid development of AMOLED, cell phones have progressed into the generations of full screen and narrow frame. The future development direction of the AMOLED will be inevitably directed to full screen, narrow frame, high resolution, flexible wearing, foldability, etc., in order to provide a user with a better use experience. In recent years, the AMOLED develops rapidly, the process matures increasingly and higher requirements are required for the stability of the performance of the screen. It is particularly important for the screen designer to optimize the connectivity of signal channels, because the performance and yield of the screen may be affected if poor connection or disconnection occurs to the signal channels.

SUMMARY

The present disclosure discloses a display substrate and a display device.

An embodiment of the present disclosure provides a display substrate, including a base substrate including a display region and a wire changing region located at a periphery of the display region, and the display substrate further including a first wire layer, a first insulating layer, a transitional connection layer, a second insulating layer, a third insulating layer, and a second wire layer sequentially arranged on the wire changing region of the substrate; where the first insulating layer is provided with a first opening; the second insulating layer is provided with a second opening; the third insulating layer is provided with a third opening; the first wire layer includes a plurality of first wires; the transitional connection layer includes a plurality of electrical connection portions; the second wire layer includes a plurality of second wires; the first wires are electrically connected to the electrical connection portions through the first opening, and the electrical connection portions are electrically connected to the second wires through the second opening and the third opening; at least two of a projection of the first opening on the substrate, a projection of the second opening on the substrate, or a projection of the third opening on the substrate are staggered in positions.

An embodiment of the present disclosure provides a display device including the above display substrate.

DETAILED DESCRIPTION

In an existing display product, a bending region includes gate signal (GOA) wires, touch signal (TP) wires, source signal (Source) wires, and data signal (Data) wires, where a part of the wires require the layer changing design.

For example, in an existing display product, a part of wires are connected in a layer changing manner between a second source-drain layer (SD2) and a gate layer (Gate), in this case, organic and inorganic layers between the two metal layers need to be excavated. For example, for the existing design, lap joint is achieved between the SD2 and the gate layer by excavating a planarization layer (PLN), a passivation layer (PVX), and an interlayer insulating layer (ILD), and in the layer changing design, via holes of the PLN, the PVX, and the ILD are designed in the same place, and the risk of signal wire breakage is more likely to occur due to an excessive drop height of film layers.

In view of the above findings, the present disclosure discloses a display substrate and a display device to provide a layer changing design solution for wires of the display substrate, which reduces the risk of wire breakage and improves the performance and yield of a display product.

The technical solutions in embodiments of the present disclosure will be clearly and fully described below in combination with the accompanying drawings in embodiments of the present disclosure, and it will be apparent that the described embodiments are only some, but not all embodiments of the present disclosure. Based on embodiments in the present disclosure, all other embodiments obtained by the ordinary skilled in the art without creative effort are within the scope of protection of the present disclosure.

Figure 1:
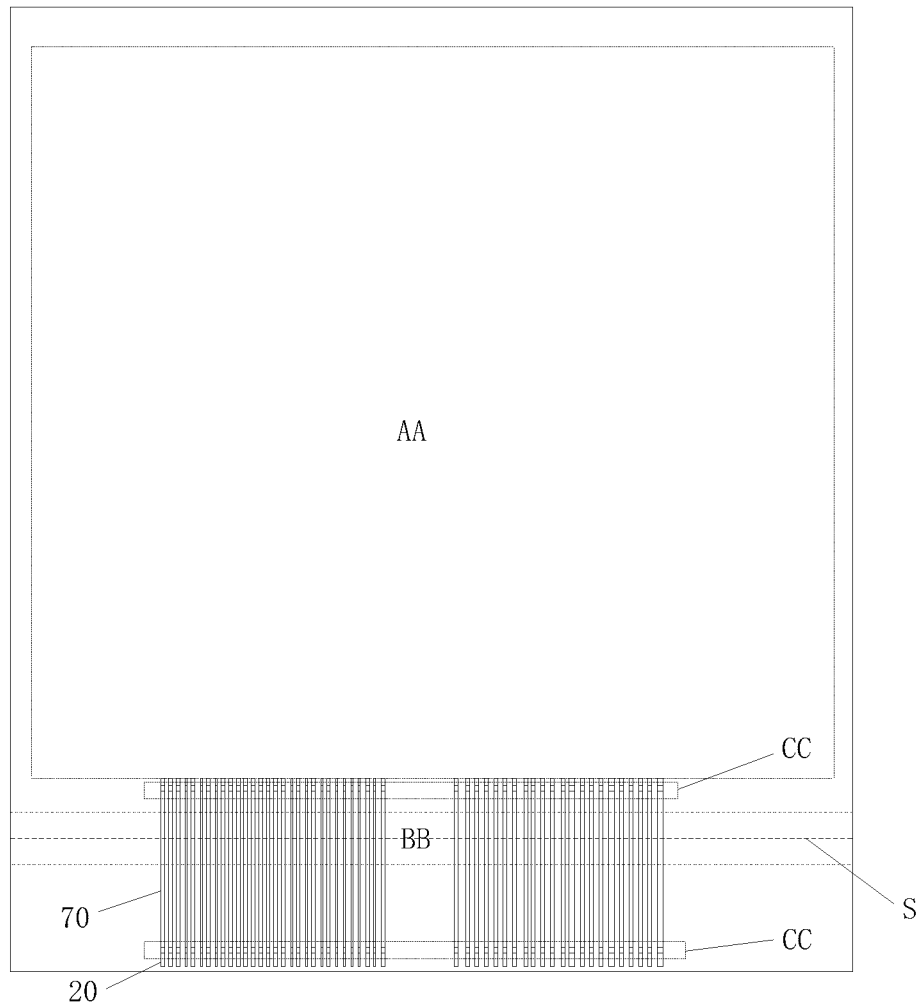
FIG. 1 is a structural schematic diagram of a display substrate provided by an embodiment of the present disclosure.
Figure 2:
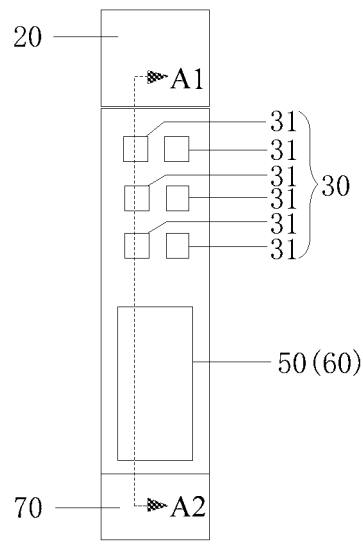
FIG. 2 is a structural schematic diagram of a partial wire changing region of the display substrate provided by an embodiment of the present disclosure.
Figure 3:
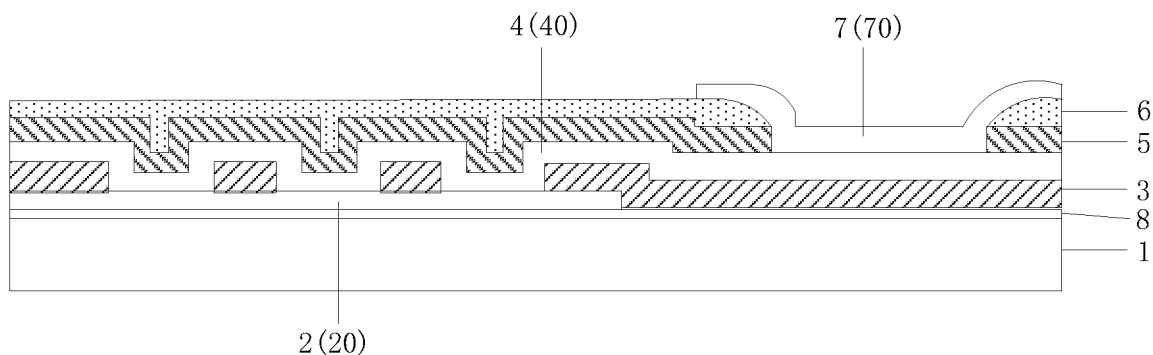
FIG. 3 is a sectional view of a display substrate in a direction A1-A2 of FIG. 2 provided by an embodiment of the present disclosure.

As shown in FIGS. 1, 2, and 3, an embodiment of the present disclosure provides a display substrate, including a substrate 1 including a display region AA and a wire changing region CC located at a periphery of the display region AA; and the display substrate further including a first wire layer 2, a first insulating layer 3, a transitional connection layer 4, a second insulating layer 5, a third insulating layer 6, and a second wire layer 7 sequentially arranged on the wire changing region CC of the substrate 1.

In some embodiments, as shown in FIGS. 2-7, the first insulating layer 3 is provided with a first opening 30; the second insulating layer 5 is provided with a second opening 50; the third insulating layer 6 is provided with a third opening 60; the first wire layer 2 includes a plurality of first wires 20; the transitional connection layer 4 includes a plurality of electrical connection portions 40; the second wire layer 7 includes a plurality of second wires 70; the first wires 20 are electrically connected to the electrical connection portions 40 through the first opening 30, and the electrical connection portions 40 are electrically connected to the second wires 70 through the second opening 50 and the third opening 60.

In some embodiments, at least two of a projection of the first opening 30 on the substrate 1, a projection of the second opening 50 on the substrate 1, or a projection of the third opening 60 on the substrate 1 are staggered in positions.

"The projections are staggered in positions", refers to that each of the staggered projections includes a region that does not overlap with other projections. For example, "two projections are staggered in positions", refers to that each of the two projections includes a region that does not overlap with the other projection.

According to the display substrate provided by an embodiment of the present disclosure, the first wires 20 and the second wires 70 are in lap joint for transition through the electrical connection portions 40; the first wires 20, the electrical connection portions 40 and the second wires 70 are in connection through the first opening 30, the second opening 50 and the third opening 60 in sequence, the second opening 50, and the third opening 60 in sequence. Moreover, since at least two of the openings are staggered in positions, a continuous drop height can be avoided, a lap joint height in layer changing is reduced, and thus the risk of breakage of signal wires is effectively reduced, to further ensure the stable transmission of the signal wires, and improve the performance and yield of the display product.

In some embodiments, the first wires 20 are in a one-to-one correspondence with the second wires 70, and corresponding wires of a same pair are electrically connected. In other words, the wires of the first wire layer 2 are in a one-to-one correspondence with the wires of the second wire layer 7, and corresponding wires of the same pair belong to a same signal line, and just extend in different layers.

In some embodiments, the display substrate further includes a gate layer, a first source-drain layer, and a second source-drain layer on the display region AA of the substrate.

In some embodiments, as shown in FIGS. 3, 4, 6 and 7, the first wire layer 2 is arranged on a same layer as gate layer; the transitional connection layer 4 is arranged on a same layer as the first source-drain layer; and the second wire layer 7 is arranged on a same layer as the second source-drain layer.

In some embodiments, as shown in FIGS. 3, 4, 6 and 7, the first insulating layer 3 is an interlayer insulating layer; the second insulating layer 5 is an inorganic passivation layer; and the third insulating layer 6 is an organic planarization layer.

In some embodiments, the gate layer may include a first gate layer and a second gate layer which are stacked. The first wire layer includes odd rows of wires and even rows of wires; the odd rows of wires are arranged on a same layer as the first gate layer; and the even rows of wires are arranged on a same layer as the second gate layer. In this way, the adjacent first wires are in different layers, and a gate insulating layer is arranged between the adjacent first wires, so that the problems of shorting, crosstalk and the like cannot occur easily.

Figure 4:
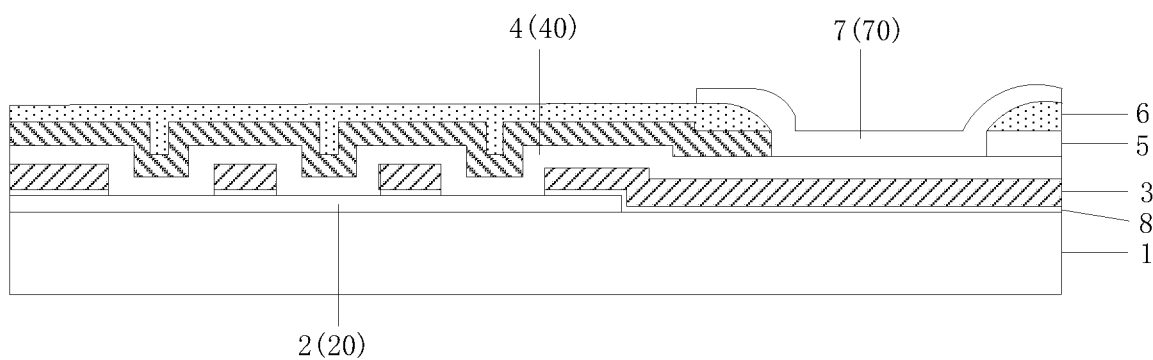
FIG. 4 is a sectional view of a display substrate in the direction A1-A2 of FIG. 2 provided by an embodiment of the present disclosure.
Figure 7:
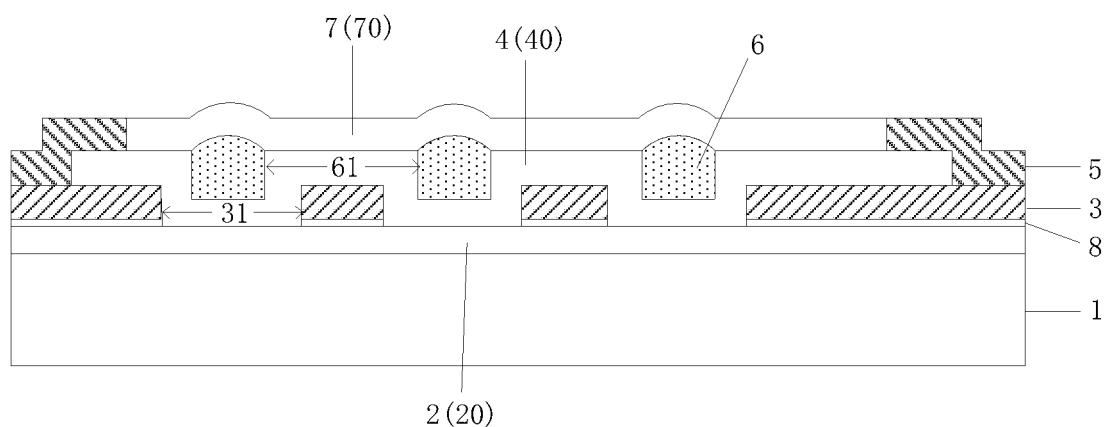
FIG. 7 is a sectional view of a display substrate in the direction B1-B2 of FIG. 5 provided by an embodiment of the present disclosure.

In some embodiments, the first gate layer is located between the substrate 1 and a gate insulating layer 8, then the odd rows of first wires 20 and second wires 70 also need to pass through the gate insulating layer 8 for layer changing. As shown in FIGS. 4 and 7, the gate insulating layer 8 is provided with a layer changing opening corresponding to the odd rows of first wires 20, and a projection of the layer changing opening on the substrate 1 approximately overlaps with a first opening in the odd row of the first insulating layer 3. In some embodiments, the layer changing opening provided by the gate insulating layer 8 and the first opening in the odd rows of the first insulating layer 3 may be prepared through a same patterning process.

Figure 6:
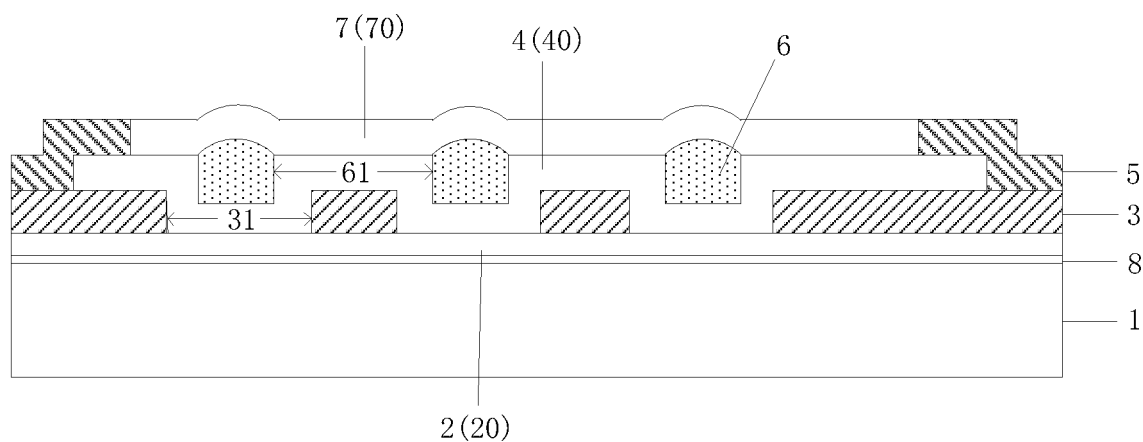
FIG. 6 is a sectional view of a display substrate in a direction B1-B2 of FIG. 5 provided by an embodiment of the present disclosure.

As shown in FIGS. 3 and 6, the even rows of first wires 20 and second wires 70 do not pass through the gate insulating layer 8 for layer changing, and the gate insulating layer 8 does not need to be provided with an opening at the layer changing position of the even rows of wires.

In some embodiments, as shown in FIGS. 3, 4, 6 and 7, the projection of the second opening 50 on the substrate 1 at least partially overlaps with the projection of the third opening 60 on the substrate 1. Therefore, the electrical connection portions 40 may be directly connected to the second wires 70 through the second opening 50 and the third opening 60 without a transitional connection structure between the second opening 50 and the third opening 60.

Figure 5:
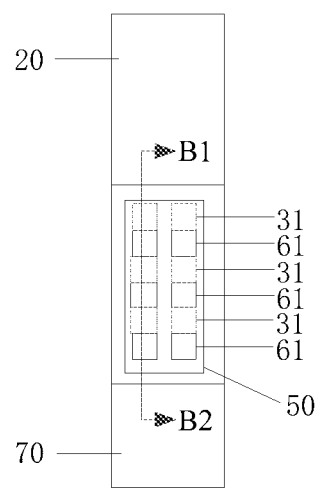
FIG. 5 is a structural schematic diagram of a partial wire changing region of a display substrate provided by an embodiment of the present disclosure.

In some embodiments, at least two of the projection of the first opening 30 on the substrate 1, the projection of the second opening 50 on the substrate 1, or the projection of the third opening 60 on the substrate 1 are staggered in positions, and as shown in FIGS. 2 and 5, a direction in which the positions are staggered is consistent with an extending direction of the first wires 20, or the direction in which the positions are staggered is consistent with an extending direction of the second wires 70.

In some embodiments, the direction in which the positions are staggered is a direction in which non-overlapping regions of the projections of the openings are arranged. For example, as shown in FIG. 5, the first wires 20 and the second wires 70 are consistent in the extending direction, a direction in which the projection of the first opening 30 and the projection of the third opening 60 are staggered in positions is consistent with the extending direction of the wires, i.e., the non-overlapping regions of the projection of the first opening 30 and the projection of the third opening 60 are arranged along the extending direction of the wires.

In some embodiments, as shown in FIGS. 2-7, a position of the projection of the first opening 30 on the substrate 1 is staggered from a position of the projection of the third opening 60 on the substrate 1.

On one hand, since the transitional connection layer 4 is arranged between the first insulating layer 3 and the third insulating layer 6, and the electrical connection portions 40 provided by the transitional connection layer 4 may be used for a transitional connection between the first wires 20 and the second wires 70, the sizes of the first opening 30 and the third opening 60 and the staggered distance between the first opening 30 provided by the first insulating layer 3 and the third opening 60 provided by the third insulating layer 6 are not limited by the distance between the first wires 20 and the second wires 70, for example, the staggered distance between the first opening 30 and the third opening 60 may be set to be relative great to simplify the preparation process. On the other hand, the third insulating layer 6 is an organic layer, and generally has a relative great thickness, staggering the third insulating layer 6 from other layers has a more significant effect on the drop height for lap joint in layer changing, and prominently reduces the risk of breakage of the signal wires.

In some embodiments, as shown in FIGS. 5, 6 and 7, the first opening 30 includes a plurality of first via holes 31; the second opening 50 is a continuous hollow portion; and the third opening includes a plurality of third via holes 61.

In some embodiments, projections of the plurality of first via holes 31 on the substrate 1 and projections of the plurality of third via holes 61 on the substrate 1 are arranged alternately.

In some embodiments, as shown in FIG. 5, the first wires 20 and the second wires 70 are consistent in the extension direction, and the projections of the plurality of first via holes 31 on the substrate and the projections of the plurality of third via holes 61 on the substrate are arranged alternately in the extending direction of the first wires 20.

In some embodiments, the projections of the adjacent first via hole 31 and third via hole 61 on the substrate 1 may not overlap; or, as shown in FIGS. 6 and 7, edges of the projection of the first via hole 31 on the substrate 1 and edges of the projection of the third via hole 61 on the substrate 1 may overlap, and the width of the overlapping region may be approximately the same as the thickness of the film layer of the electrical connection portion 40.

In some embodiments, as shown in FIG. 5, the projections of the plurality of first via holes 31 and the plurality of third via holes 61 on the substrate 1 are located within the projection of the second opening 50 on the substrate 1.

In an embodiment of the present disclosure, the projections of the plurality of first via holes 31 on the substrate 1 and the projections of the plurality of third via holes 61 on the substrate are arranged alternately. In this way, in a layer changing region for the openings, the film layer of the third insulating layer 6 is mainly located in the first via holes 31, and an upper surface of the third insulating layer 6 has a small height, as shown in FIGS. 6 and 7, so that the drop height for the lap joint of the film layers between the second wires 70 and the electrical connection portions 40 is very small, thus the risk of breakage of the signal wires is effectively reduced.

In some embodiments, as shown in FIGS. 2, 3 and 4, the first opening 30 includes a plurality of first via holes 31; the second opening 50 is a continuous hollow portion; and the third opening 60 is a continuous hollow portion.

In some embodiments, no overlapping area is present between projections of the plurality of first via holes 31 on the substrate 1 and projections of the second opening 50 and the third opening 60 on the substrate 1. That is, the projection of the first opening 30 on the substrate 1 and the projections of the second opening 50 and the third opening 60 on the substrate 1 are completely staggered and do not overlap.

In some embodiments, the projection of the second opening 50 on the substrate 1 substantially overlaps with the projection of the third opening 60 on the substrate 1.

In an embodiment of the present disclosure, the projections of the plurality of first via holes 31 are staggered from the projections of the second opening 50 and the third opening 60. In this way, the height of the film layer of the electrical connection portions 40 below the second opening 50 and the third opening 60 is consistent, no continuous drop height is present when the film layers between the second wires 70 and the electrical connection portions 40 are in lap joint, and the overall drop height is relative small, to effectively reduce the risk of breakage of the signal wires.

In some embodiments, the first wires may include one or several of a touch signal wire, a gate signal wire, and a data signal wire. In other words, in embodiments of the present disclosure, the layer changing design between the first wires and the second wires may be used for the layer changing of the touch signal wire, the layer changing of the gate signal wire, or the layer changing of the data signal wire.

In some embodiments, as shown in FIG. 1, the first wires 20 and second wires 70 are located at the periphery of the display substrate, one end of each pair of first wire 20 and second wire 70 extends towards the display region AA, and the other end of each pair of the first wire 20 and the second wire 70 extends towards a direction away from the display region AA.

In some embodiments, as shown in FIG. 1, the substrate 1 includes a bend region BB on a side of the display region AA, the bend region BB may be bent along a bend line S, and the bend line S intersects with the extending direction of the second wires 70.

In some embodiments, the wire changing region CC includes at least one of regions at two sides of the bend line S. For example, as shown in FIG. 1, a wire changing region CC of an embodiment of the present disclosure may be arranged on a side of the bend line S close to the display region AA, and a wire changing region CC of an embodiment of the present disclosure may be arranged on a side of the bend line S away from the display region AA. Each signal wire may be changed once within each of the two wire changing regions.

For example, by taking a gate signal wire as an example, after extending from the display region to the peripheral non-display region, the gate signal wire is first changed from the gate layer to the second source-drain layer through the layer changing design, and after extending for a certain distance on the second source-drain layer and passing through the bend region, the gate signal wire is changed from the second source-drain layer to the gate layer again through the layer changing design. Both of the two layer changing designs may adopt the solutions in embodiments of the present disclosure, now, a section of the wire extending in the gate layer is equivalent to a first wire, a section of the wire extending in the second source-drain layer is equivalent to a second wire. A data signal wire and a touch signal wire adopt the similar designs, the difference only lies in a different first layer changing design, where the data signal wire is initially located on the second source-drain layer without the first layer changing, and the touch signal wire is changed from a touch electrode layer to the second source-drain layer during the first layer changing.

In addition, an embodiment of the present disclosure also provides a display device including the above any one of the display substrates.

The display device provided by an embodiment of the present disclosure can effectively reduce the risk of breakage of signal wires, to ensure stable transmission of the signal wires, and improve the performance and yield of a display product. The display device may be applied to devices such as cell phones, PADs and displays.

It should be noted that in some embodiments of the present disclosure, the display substrate and the display device may also include other structures, which depends on practical requirements, and is not limited in embodiments of the present disclosure. In addition, the various embodiments of the present disclosure are merely examples of the specific embodiments, and the disclosed embodiments of the present disclosure are not limited to the foregoing embodiments.

Obviously, those skilled in the art can make various modifications and variations to embodiments of the present disclosure without departing from the spirit and scope of the present disclosure. Therefore, the present disclosure intends to include such modifications and variations in the case that these modifications and the variations come within the scope of the claims and equivalents thereof.

What is claimed is:

1. A display substrate, comprising a base substrate comprising a display region and a wire changing region located at a periphery of the display region, and the display substrate further comprising a first wire layer, a first insulating layer, a transitional connection layer, a second insulating layer, a third insulating layer, and a second wire layer sequentially arranged on the wire changing region of the substrate; wherein, the first insulating layer is provided with a first opening; the second insulating layer is provided with a second opening; the third insulating layer is provided with a third opening; the first wire layer comprises a plurality of first wires; the transitional connection layer comprises a plurality of electrical connection portions; the second wire layer comprises a plurality of second wires;

the first wires are electrically connected to the electrical connection portions through the first opening, and the electrical connection portions are electrically connected to the second wires through the second opening and the third opening; and at least two of a projection of the first opening on the substrate, a projection of the second opening on the substrate, or a projection of the third opening on the substrate are staggered in positions.

2. The display substrate of claim 1, wherein the projection of the second opening on the substrate at least partially overlaps with the projection of the third opening on the substrate.

3. The display substrate of claim 1, wherein a position of the projection of the first opening on the substrate is staggered from a position of the projection of the third opening on the substrate.

4. The display substrate of claim 3, wherein the first opening comprises a plurality of first via holes; the second opening is a continuous hollow portion; the third opening comprises a plurality of third via holes; and projections of the plurality of first via holes on the substrate and projections of the plurality of third via holes on the substrate are alternately arranged.

5. The display substrate of claim 4, wherein the projections of the plurality of first via holes and the projections of the plurality of third via holes on the substrate are within the projection of the second opening on the substrate.

6. The display substrate of claim 3, wherein the first opening comprises a plurality of first via holes; the second opening is a continuous hollow portion; the third opening is a continuous hollow portion; and no overlapping area is present between projections of the plurality of first via holes on the substrate and projections of the second opening and the third opening on the substrate.

7. The display substrate of claim 6, wherein the projection of the second opening on the substrate substantially overlaps with the projection of the third opening on the substrate.

8. The display substrate of claim 1, wherein a direction in which the positions are staggered is consistent with an extending direction of the first wires, or is consistent with an extending direction of the second wires.

9. The display substrate of claim 1, wherein the display substrate further comprises a gate layer, a first source-drain layer, and a second source-drain layer on the display region of the substrate;

the first wire layer is arranged on a same layer as the gate layer;

the transitional connection layer is arranged on a same layer as the first source-drain layer; and the second wire layer is arranged on a same layer as the second source-drain layer.

10. The display substrate of claim 9, wherein the first insulating layer is an interlayer insulating layer; the second insulating layer is an inorganic passivation layer; and the third insulating layer is an organic planarization layer.

11. The display substrate of claim 9, wherein the gate layer comprises a first gate layer and a second gate layer which are stacked; and the first wire layer comprises odd rows of wires and even rows of wires, the odd rows of wires are arranged on a same layer as the first gate layer, and the even rows of wires are arranged on a same layer as the second gate layer.

12. The display substrate of claim 9, wherein the substrate comprises a bend region at the periphery of the display region, and is bendable along a bend line; the bend line intersects with an extending direction of the second wires; and the wire changing region comprises one of regions at two sides of the bend line.

13. The display substrate of claim 1, wherein the first wires are in a one-to-one correspondence with the second wires, and a pair of corresponding wires are electrically connected.

14. The display substrate of claim 1, wherein the first wires comprise one or several of a touch signal wire, a gate signal wire, and a data signal wire.

15. A display device, comprising a display substrate comprising a base substrate comprising a display region and a wire changing region located at a periphery of the display region, and the display substrate further comprising a first wire layer, a first insulating layer, a transitional connection layer, a second insulating layer, a third insulating layer, and a second wire layer sequentially arranged on the wire changing region of the substrate; wherein, the first insulating layer is provided with a first opening; the second insulating layer is provided with a second opening; the third insulating layer is provided with a third opening; the first wire layer comprises a plurality of first wires; the transitional connection layer comprises a plurality of electrical connection portions; the second wire layer comprises a plurality of second wires;

the first wires are electrically connected to the electrical connection portions through the first opening, and the electrical connection portions are electrically connected to the second wires through the second opening and the third opening; and at least two of a projection of the first opening on the substrate, a projection of the second opening on the substrate, or a projection of the third opening on the substrate are staggered in positions.

16. The display device of claim 15, wherein the projection of the second opening on the substrate at least partially overlaps with the projection of the third opening on the substrate.

17. The display device of claim 15, wherein a position of the projection of the first opening on the substrate is staggered from a position of the projection of the third opening on the substrate.

18. The display device of claim 17, wherein the first opening comprises a plurality of first via holes; the second opening is a continuous hollow portion; the third opening comprises a plurality of third via holes; and projections of the plurality of first via holes on the substrate and projections of the plurality of third via holes on the substrate are alternately arranged.

19. The display device of claim 18, wherein the projections of the plurality of first via holes and the projections of the plurality of third via holes on the substrate are within the projection of the second opening on the substrate.

20. The display device of claim 17, wherein the first opening comprises a plurality of first via holes; the second opening is a continuous hollow portion; the third opening is a continuous hollow portion; and no overlapping area is present between projections of the plurality of first via holes on the substrate and projections of the second opening and the third opening on the substrate.

\* \* \* \* \*